(12) United States Patent
Shih et al.

(10) Patent No.: US 11,205,607 B2
(45) Date of Patent: Dec. 21, 2021

(54) SEMICONDUCTOR STRUCTURE AND METHOD OF MANUFACTURING THEREOF

(71) Applicant: NANYA TECHNOLOGY CORPORATION, New Taipei (TW)

(72) Inventors: Chiang-Lin Shih, New Taipei (TW); Hsih-Yang Chiu, Taoyuan (TW); Ching-Hung Chang, Taoyuan (TW); Pei-Jhen Wu, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/739,106

(22) Filed: Jan. 9, 2020

(65) Prior Publication Data
US 2021/0217684 A1 Jul. 15, 2021

(51) Int. Cl.
*H01L 21/768* (2006.01)
*H01L 23/48* (2006.01)
*H01L 23/00* (2006.01)

(52) U.S. Cl.
CPC ...... *H01L 23/481* (2013.01); *H01L 21/76804* (2013.01); *H01L 21/76877* (2013.01); *H01L 24/11* (2013.01); *H01L 24/13* (2013.01)

(58) Field of Classification Search
CPC .......................... H01L 24/11; H01L 21/76877
See application file for complete search history.

(56) References Cited

U.S. PATENT DOCUMENTS

| | | | | |
|---|---|---|---|---|
| 6,110,825 | A * | 8/2000 | Mastromatteo | ... H01L 21/76898 257/E21.597 |
| 11,031,375 | B2 * | 6/2021 | Lee | .................... H01L 23/53223 |
| 2009/0108464 | A1 * | 4/2009 | Uchiyama | ............. H01L 23/481 257/774 |
| 2009/0305502 | A1 * | 12/2009 | Lee | ....................... H01L 23/481 438/667 |
| 2011/0133333 | A1 * | 6/2011 | Kwon | ..................... H01L 24/11 257/737 |
| 2012/0018876 | A1 * | 1/2012 | Wu | ....................... H01L 23/147 257/737 |
| 2012/0049349 | A1 * | 3/2012 | Lee | ................... H01L 21/76898 257/737 |

(Continued)

FOREIGN PATENT DOCUMENTS

TW 201946146 A 12/2019

*Primary Examiner* — Michele Fan
(74) *Attorney, Agent, or Firm* — CKC & Partners Co., LLC

(57) ABSTRACT

A semiconductor structure and a method of manufacturing thereof are provided. The semiconductor includes a semiconductor integrated circuit device and a redistribution layer structure. The semiconductor integrated circuit device has a top surface and an electrode on the top surface. The redistribution layer structure is formed on the top surface. The redistribution layer structure includes an oxide layer, a nitride layer, a dielectric layer, a groove and a through via. The oxide layer and the nitride layer are formed on the top surface. The dielectric layer is formed on the nitride layer. The groove is formed at a topside of the dielectric layer and overlaps the electrode. The through via is formed at a bottom of the groove and extends within the electrode through the dielectric layer, the nitride layer and the oxide layer. The through via and the groove are filled with a conductive material.

5 Claims, 10 Drawing Sheets

(56) References Cited

U.S. PATENT DOCUMENTS

| | | | |
|---|---|---|---|
| 2013/0207241 A1* | 8/2013 | Lee | H01L 23/5226 |
| | | | 257/621 |
| 2015/0137326 A1* | 5/2015 | Kang | H01L 23/481 |
| | | | 257/621 |
| 2015/0194345 A1* | 7/2015 | Chen | H01L 21/76807 |
| | | | 257/774 |
| 2016/0268182 A1* | 9/2016 | Lee | H01L 23/5384 |
| 2017/0053872 A1* | 2/2017 | Lee | H01L 21/76898 |
| 2018/0025991 A1 | 1/2018 | Koketsu et al. | |
| 2019/0287820 A1* | 9/2019 | Huang | H01L 24/19 |
| 2020/0303200 A1* | 9/2020 | Hu | H01L 23/3185 |
| 2020/0357690 A1* | 11/2020 | Park | H01L 21/76898 |

* cited by examiner

SEMICONDUCTOR STRUCTURE AND METHOD OF MANUFACTURING THEREOF

BACKGROUND

Field of Invention

The present disclosure relates to a semiconductor structure and method of manufacturing thereof.

Description of Related Art

A redistribution layer structure is used to redistribute electrodes of semiconductor devices, and the redistributed electrodes can have better locations connected to other device in a better way. However, with the additional redistribution layer structure, the additional RLC performance of the semiconductor devices is affected.

For example, one of the semiconductor devices includes a DRAM memory cell having a capacitor and a transistor, the redistribution layer structure is used to redistribute exposed contacts of the capacitor and the transistor, and the RLC performance becomes an important issue.

Accordingly, how to improve the RLC performance of the redistribution layer structure by a manufacturing process with low cost is a subject solved by those in the industry.

SUMMARY

To achieve the above object, one aspect of the present disclosure is relative to a semiconductor structure.

According to one embodiment of the present disclosure, a semiconductor structure includes a semiconductor integrated circuit device and a redistribution layer structure. The semiconductor integrated circuit device has a top surface and an electrode extending to the top surface. The redistribution layer structure is formed on the top surface of the semiconductor integrated circuit device. The redistribution layer structure includes an oxide layer, a nitride layer, a dielectric layer, a groove and a through via. The oxide layer is formed on the top surface. The nitride layer is formed on the oxide layer. The dielectric layer is formed on the nitride layer. The dielectric layer has a greater thickness than a thickness of the oxide layer and the nitride layer. The groove is formed at a topside of the dielectric layer and overlaps the electrode. The through via is formed at a bottom of the groove. The through via extends to a portion within the electrode from the bottom of the groove through the dielectric layer, the nitride layer and the oxide layer vertically. The through via and the groove are filled with a conductive material.

In one or more embodiments of the present disclosure, a depth of the groove is equal to or less than 25% of a thickness of the dielectric layer.

In one or more embodiments of the present disclosure, a width of the through via is equal to or less than one-third of a width of the groove.

In one or more embodiments of the present disclosure, a thickness of the dielectric layer is in a range of 8 μm to 10 μm.

In one or more embodiments of the present disclosure, the semiconductor structure further includes an insulating layer, a metal layer and a conductive bump. The insulating layer is formed on the dielectric layer. A window is formed within the insulating layer to expose the groove at the topside of the dielectric layer. The metal layer is formed on the insulating layer and filling the window to contact the conductive material. In some embodiments, the semiconductor structure further includes a conductive bump formed on the metal layer. In some embodiments, a width of the window is less than a width of the groove.

One aspect of the present disclosure is relative to a method of manufacturing a redistribution layer structure.

According to one embodiment of the present disclosure, a method is used to manufacture a semiconductor structure. The method includes following operations. Provide a semiconductor integrated circuit device having a top surface and an electrode extending to the top surface. Form an oxide layer and a nitride layer on the top surface sequentially. Form a dielectric layer having a greater thickness than the oxide layer and the nitride layer. Form a groove on a topside of the dielectric layer, wherein the groove overlaps the electrode of the semiconductor structure. Forming a through via at a bottom of the groove, wherein the groove extends from the bottom of the groove to the electrode through the dielectric layer, the nitride layer and the oxide layer vertically. Fill conductive material into the through via and the groove.

In one or more embodiments of the present disclosure, the method further includes following operation. Flatten the topside of the dielectric layer.

In one or more embodiments of the present disclosure, the method further includes following operations. Form an insulating layer on the dielectric layer. Form a window within the insulating layer to expose the conductive material in the groove. Form a metal layer on the insulating layer and within the window to contact the conductive material. In some embodiments, the method further includes forming a conductive bump on the metal layer.

In one or more embodiments of the present disclosure, the oxide layer and the dielectric layer are silicon oxide, the nitride layer is silicon nitride, and the forming the through via at the bottom of the groove is performed by a through silicon via process.

In summary, for the semiconductor structure, the redistribution layer structure formed on the provided semiconductor integrated circuit device can be constructed by a groove and a through via. For example, the dielectric layer, the oxide layer and the nitride can be silicides, and the through via can be formed by a mature through silicon via process, which is with low cost. In addition, the dielectric layer can have a large thickness, the effective capacity of the dielectric layer can be reduced, and the RLC performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1:
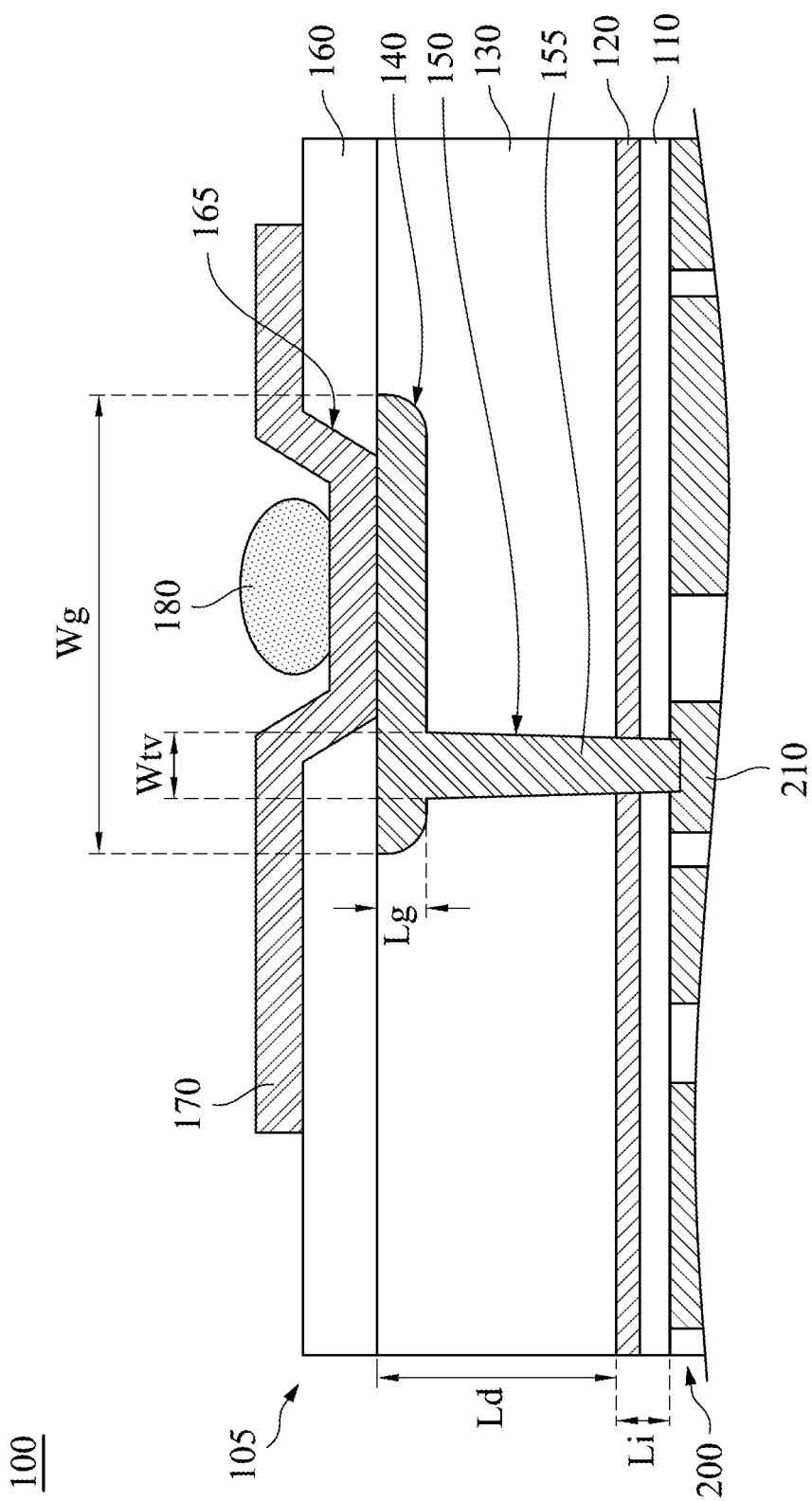
FIG. 1 is a schematic cross section of a semiconductor structure formed by a redistribution layer structure and a semiconductor integrated circuit device according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Please refer to FIG. 1. FIG. 1 is a schematic cross section of a semiconductor structure 100 according to one embodiment of the present disclosure. The semiconductor structure 100 includes a redistribution layer structure 105 and a semiconductor integrated circuit device 200. The redistribution layer structure 105 is formed on a semiconductor integrated circuit device 200.

As shown in FIG. 1, a semiconductor integrated circuit device 200 is provided, and electrodes 210 are exposed form a top surface of the semiconductor integrated circuit device 200. In some embodiments, the semiconductor integrated circuit device 200 is a DRAM structure, and the exposed electrodes 210 are respectively connected to one terminal of one of transistor or one of capacitors of the DRAM. Therefore, RLC issue is an important subject for semiconductor integrated circuit device 200. In some embodiments, the electrodes 210 are metal pads connected to the elements in the semiconductor integrated circuit device 200.

The redistribution layer structure 105 is formed on the top surface of the semiconductor integrated circuit device 200. In this embodiments, the redistribution layer structure 105 includes an oxide layer 110, a nitride layer 120, a dielectric layer 130, a groove 140 and a through via 150.

The oxide layer 110 is formed on the top surface of the semiconductor integrated circuit device 200. In some embodiments, the oxide layer 110 is used as a thin dielectric isolating the electrodes 210. In this embodiment, the oxide layer 110 is silicon oxide.

The nitride layer 120 is formed on the oxide layer 110. In some embodiments, the nitride layer 120 is used to increase the structural strength of the redistribution layer structure 105. In this embodiment, the nitride layer 120 is silicon nitride but not limited to the present disclosure.

The dielectric layer 130 is formed on the nitride layer 120. As shown in FIG. 1, the dielectric layer 130 has a greater thickness Ld than a thickness Li of the oxide layer 110 and the nitride layer 120. With the great thickness Ld, the total capacity caused by the dielectric layer 130 is reduced. The dielectric layer 130 includes a bottom side and a topside. The bottom side of the dielectric layer 130 is close to the nitride layer 120. The topside is opposite to the bottom side. In this embodiment, the dielectric layer 130 is silicon oxide but not limited to the present disclosure.

The groove 140 is formed at the topside and within the dielectric layer 130. As shown in FIG. 1, the groove 140 has a depth Lg, and the depth Lg of the groove 140 is less than the thickness Ld of the dielectric layer 130. The groove 140 overlaps one of the electrodes 210 of the semiconductor integrated circuit device 200. In this embodiment, the groove 140 has a vertical projection on the top surface of the semiconductor integrated circuit device 200, and the vertical projection of the groove 140 covers the one of the electrodes 210. In some embodiments, the covered electrode 210 is located at the center of the vertical projection of the groove 140. In some embodiments, the groove 140 can partially overlap one of the electrodes 210 of the semiconductor integrated circuit device 200.

The through via 150 is formed at a bottom of the groove 140. As shown in FIG. 1, the through via 150 vertically extends from the bottom of the groove 140 to a portion within the electrode 210. Specifically, the through via 150 extends through the dielectric layer 130, the nitride layer 120 and the oxide layer 110.

As shown in FIG. 1, the through via 150 and the groove 140 are filled with conductive material 155. In this embodiment, the conductive material 155 is cooper but not limited to the present disclosure. Therefore, one of the electrodes 210 can be connected to the topside of the dielectric layer 130 through conductive material 155 within the groove 140 and the through via 150.

In this embodiment, the dielectric layer 130 can have a great thickness Ld. In some embodiments, the thickness Ld of the dielectric layer 130 can be in a range of 8 μm to 10 μm. In some embodiments, the dielectric layer 130 can have even greater thickness Ld. Since the connection of the redistribution layer structure 105 is performed by the through via 150, the greater thickness Ld does not cause larger cost. Further, in this embodiments, the dielectric layer 130, the oxide layer 110 and the nitride layer 120 are silicides, and the through via 150 can be formed by a mature through silicon via process.

Return to FIG. 1. In this embodiment, the redistribution layer structure 105 includes an insulating layer 160, a metal layer 170 and a conductive bump 180. In this embodiment, the insulating layer 160 is silicon oxide but not limited to the present disclosure.

As shown in FIG. 1, a window 165 is formed within the insulating layer 160 to expose the conductive material 155 exposed from the topside of the dielectric layer 130. In other words, the window 165 exposes the groove 140 filled with the conductive material 155. In this embodiment, the width of window 165 is less than the width Wg of the groove 140 to avoid unexpected contact of the conductive material 155.

The metal layer 170 is formed on the insulating layer 160 and within the window 165 to contact the conductive material 155. Thus, the electrode 210 is connected to the metal layer 170 through the through via 150 filled with conductive material 155. Therefore, electrode 210 can be connected through the metal layer 170. For example, in this embodiment, the conductive bump 180 is formed on the metal layer 180 to connect the electrode 210 under the redistribution layer structure 105. In this embodiment, the metal layer 170 is aluminum but not limited to the present disclosure.

In this embodiment, the conductive bump 180 is formed within the window 165, and the conductive bump 180 can further connect to other conductive lines. In some embodiments, the conductive bump 180 can be formed outside the window 165. For example, the conductive bump 180 can be formed on a portion of the top surface of the metal layer 170, the portion of the top surface of the metal layer 170 is on the topside of the insulating layer 160, and the conductive bump 180 does not overlap the groove 140.

The groove 140 is formed to roughly align the electrode 210, and the through via 150 can further extend to the electrode 210. Therefore, the depth Lg of the groove can be very shallow. In some embodiments, depth Lg of the groove 140 is equal to or less than 25% of the thickness Ld of the dielectric layer 130. In some embodiments, the thickness Ld of the dielectric layer 130 is in the range of 8 μm and 10 μm, and the depth Lg of the groove 140 is in the range of 1 μm and 2 μm.

After the groove 140 is formed, the electrode 210 on top surface of the semiconductor integrated circuit device 200 is aligned, and the through via 150 can accurately extend to the electrode 210. In some embodiments, the shape of the groove 140 at the topside of the dielectric layer 130 is a rectangular or octagonal. As shown in FIG. 1, a width Wtv of the through via 150 is less than the width Wg of the groove 140 to avoid that the position where the through via 150 is formed is not in the groove 140 by some errors. In some embodiments, the width Wtv of the through via 150 is equal or less than one-third of the width Wg of the groove 140. In some embodiments, the width Wtv of the through via 150 is 3 μm, and the width Wg of the groove 140 is about 10 μm or larger. In some embodiments, the width Wtv of the through via 150 is 5 μm, and the width Wg of the groove 140 is about 15 μm or larger. In some embodiments, the width Wtv of the through via 150 is 7 μm, and the width Wg of the groove 140 is about 25 μm or larger.

In this embodiment, the depth of the through via 150 is about 10 μm, so the through via 150 is also called as a small through via structure. In some embodiments, the center of the groove 140 can align the electrode 210.

Figure 2:
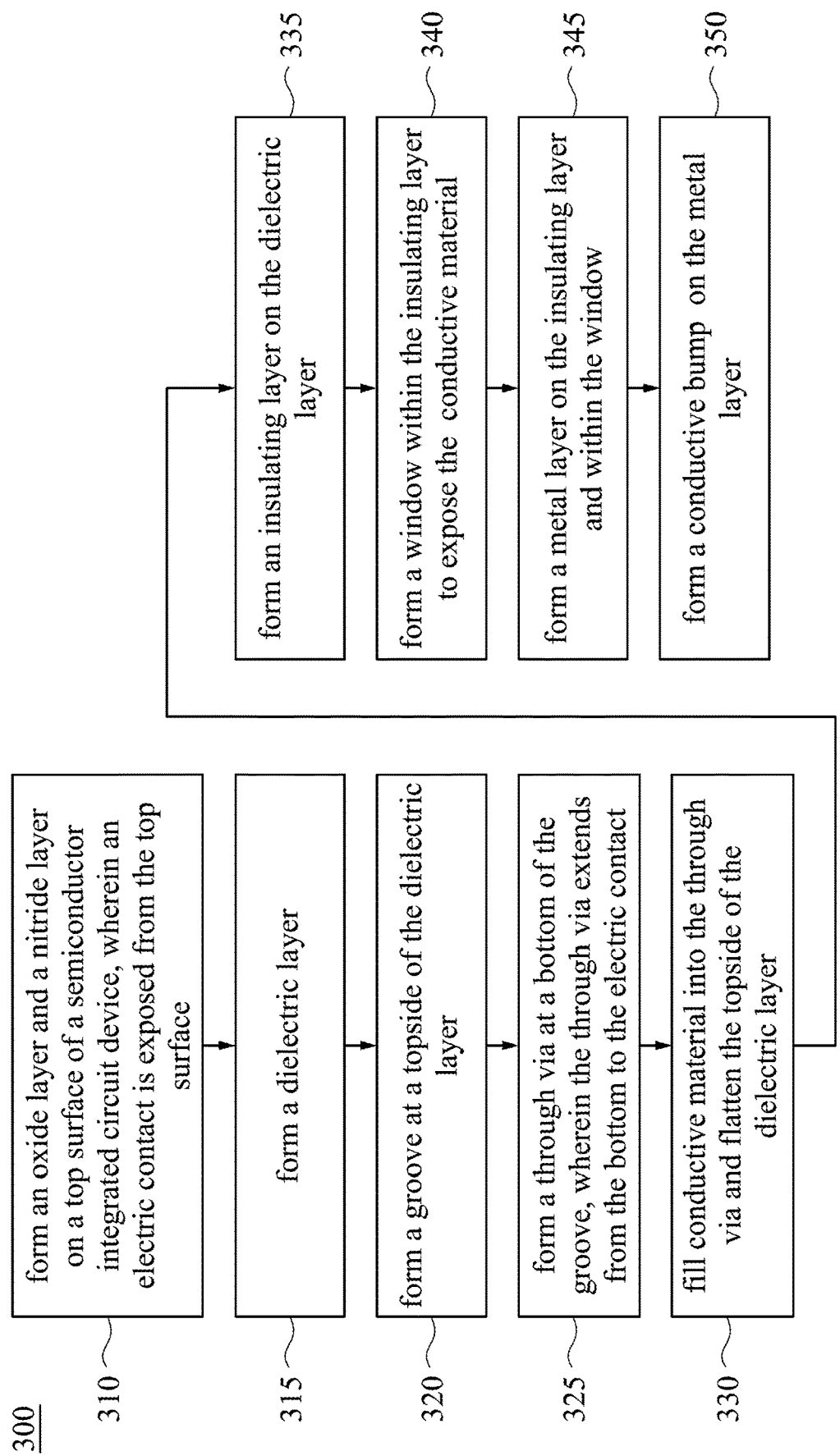
FIG. 2 is a flow chart of a method of manufacturing a semiconductor structure including a redistribution layer and a semiconductor integrated circuit device according to one embodiment of the present disclosure.

Please refer to FIG. 2, which is a flow chart of a method 300 of manufacturing a semiconductor structure 100 including a redistribution layer structure 105 and a semiconductor integrated circuit device 200 according to one embodiment of the present disclosure. Also refer to FIGS. 3-11, which illustrate the cross sections in different operations of the method of manufacturing a semiconductor structure 100 according to one embodiment of the present disclosure.

Figure 3:
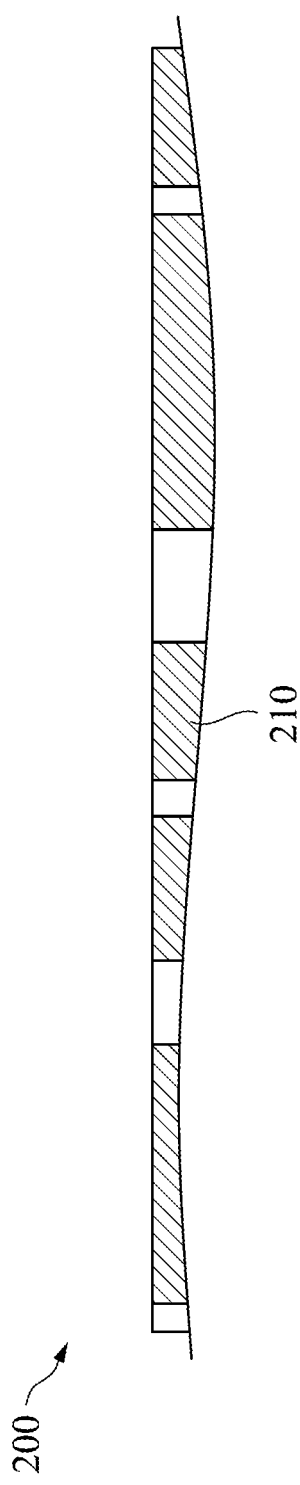
FIGS. 3-11 illustrate the cross sections in different operations of the method of manufacturing a semiconductor structure according to one embodiment of the present disclosure.
Figure 4:
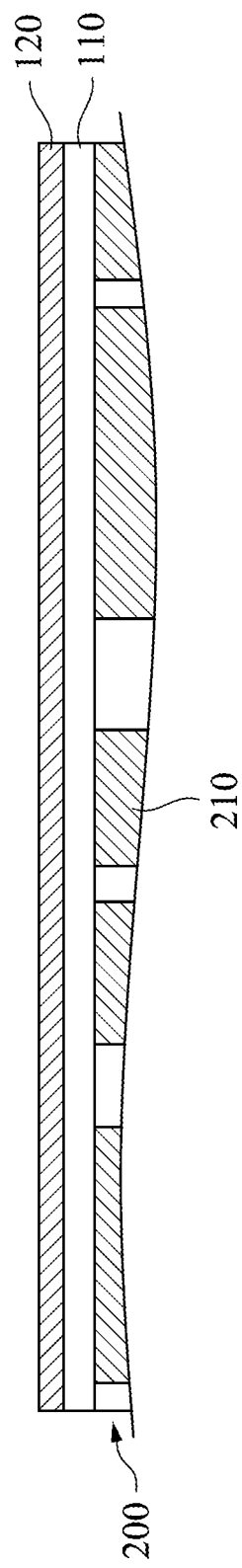

In FIG. 3, and semiconductor integrated circuit device 200 with exposed electrodes 210 is provided. In operation 310 (also referring to FIG. 4), an oxide layer 110 and the nitride layer 120 are formed on the top surface of the semiconductor integrated circuit device 200.

Figure 5:
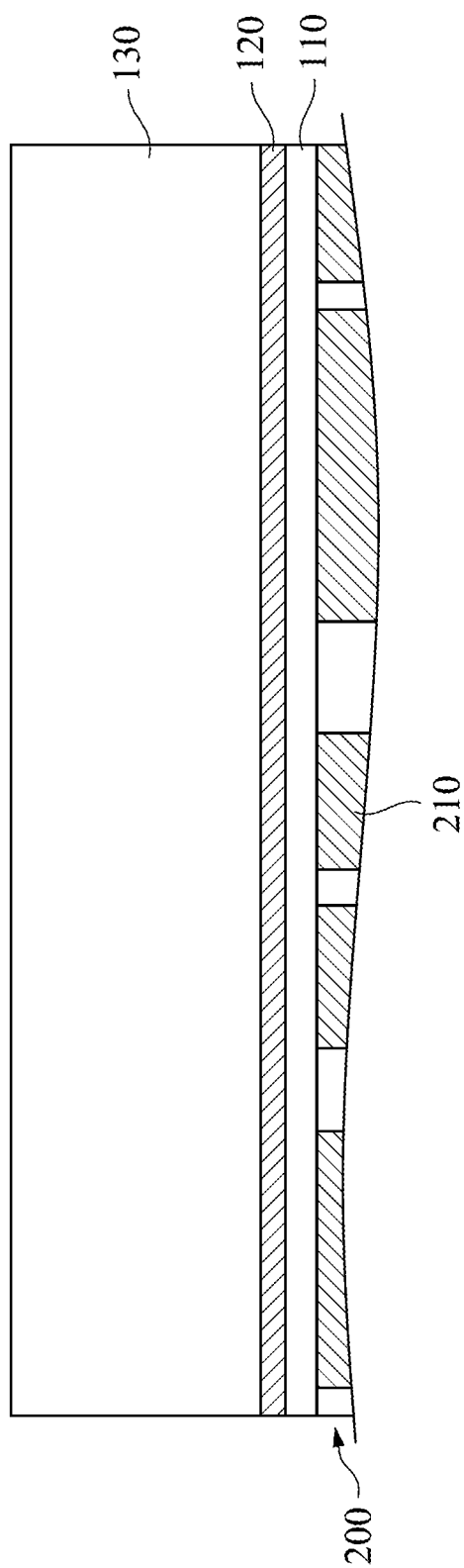

In operation 310, in operation 315, a dielectric layer 130 is formed on the nitride layer 120. As shown in FIG. 5, the dielectric layer 130 has a greater thickness than the oxide layer 110 and the nitride layer 120.

Figure 6:
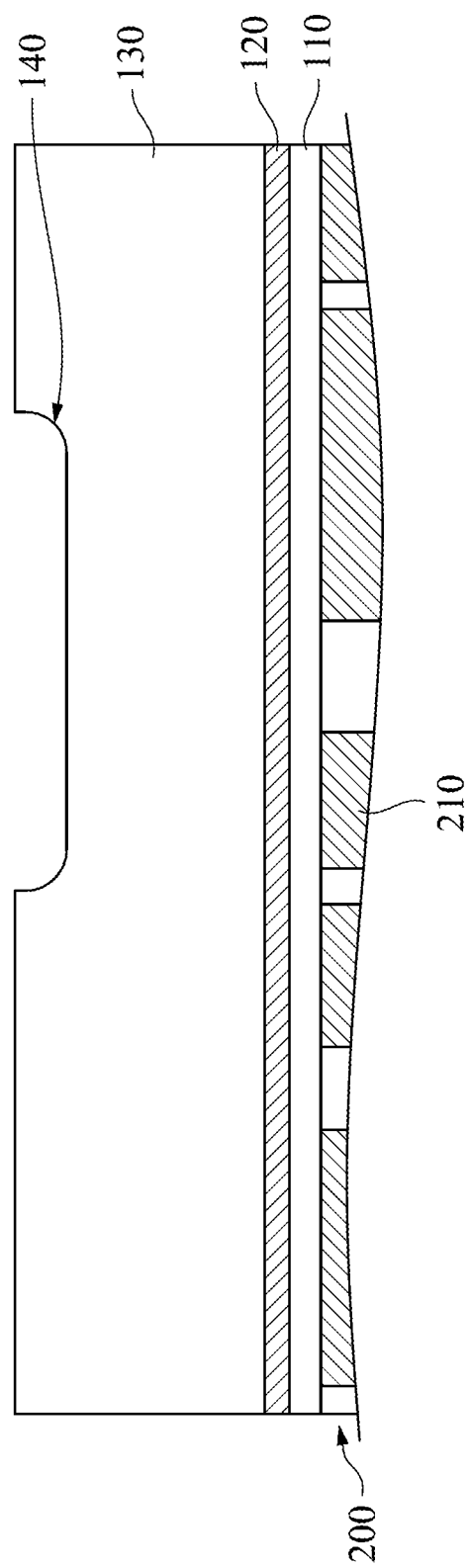

Continued with operation 315, as shown in FIG. 6, in operation 320, a groove 140 is formed at a topside of the dielectric layer 130. The groove 140 concaves from the topside of the dielectric layer 130 and overlaps one of the electrodes 210 of the semiconductor integrated circuit device 200. Therefore, the one of the electrodes 210 is aligned with the groove 140.

Figure 7:
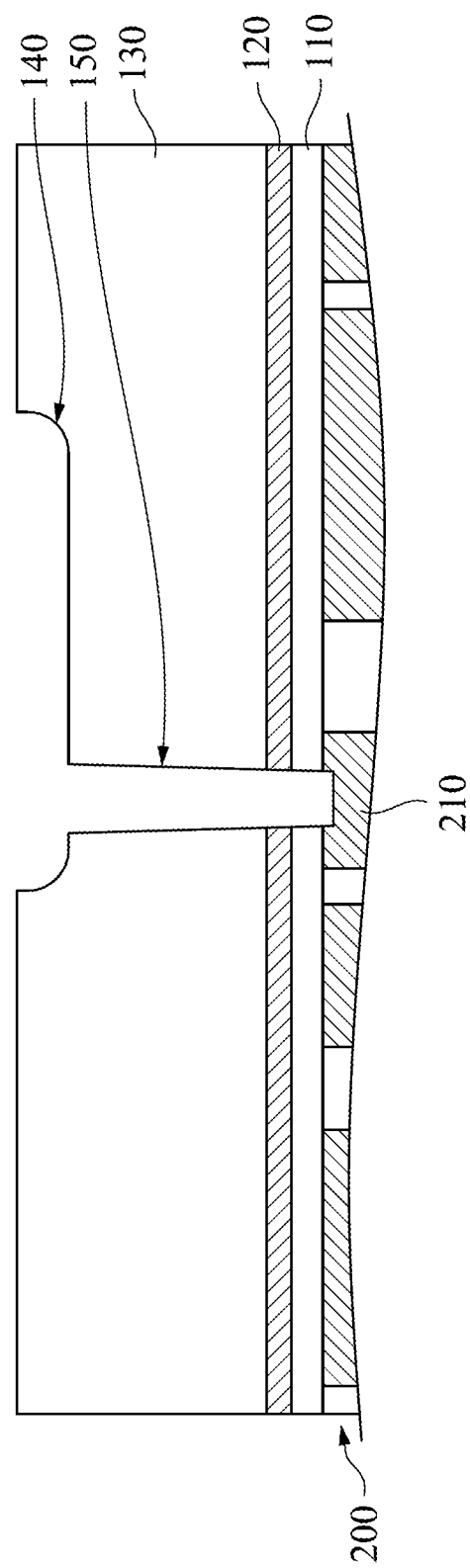

In operation 325, a through via 150 is formed at a bottom of the groove 140. As shown in FIG. 7, the groove 140 extends from the bottom of the groove 140 to the electrode 210 vertically. The through via 150 extends through the dielectric layer 130, the nitride layer 120 and the oxide layer 110. In this embodiment, the oxide layer 110 and the dielectric layer 130 are silicon oxide, the nitride layer 120 is silicon nitride, and the step of forming the through via at the bottom of the groove is performed by a mature through silicon via process.

Figure 8:
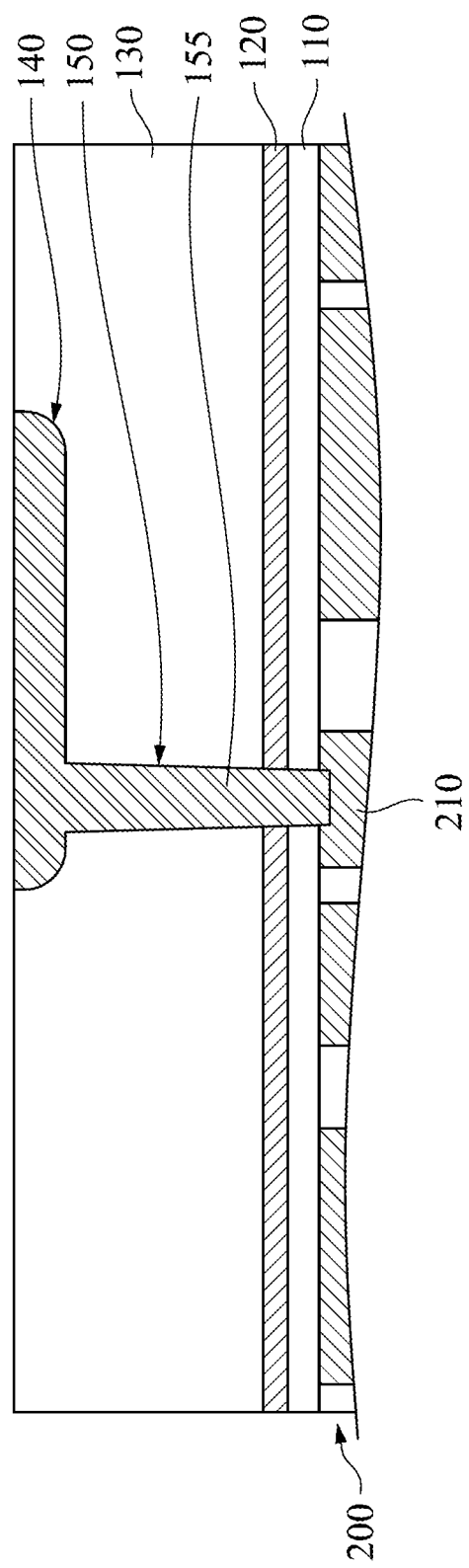

Continued with operation 325, in operation 330, the through via 150 and the groove 140 is filled with the conductive material 155, as shown in FIG. 8. Further, as shown in FIG. 8, the topside of the dielectric layer 130 is flattened. In some embodiments, the flattening is performed by a chemical mechanical planarization process.

Operations 320, 325 and 330 are collectively referred to as a dual damascene process. The dual damascene process is that filling the conductive material 155 after forming the groove 140 and the through via 150 within the groove 140.

Figure 9:
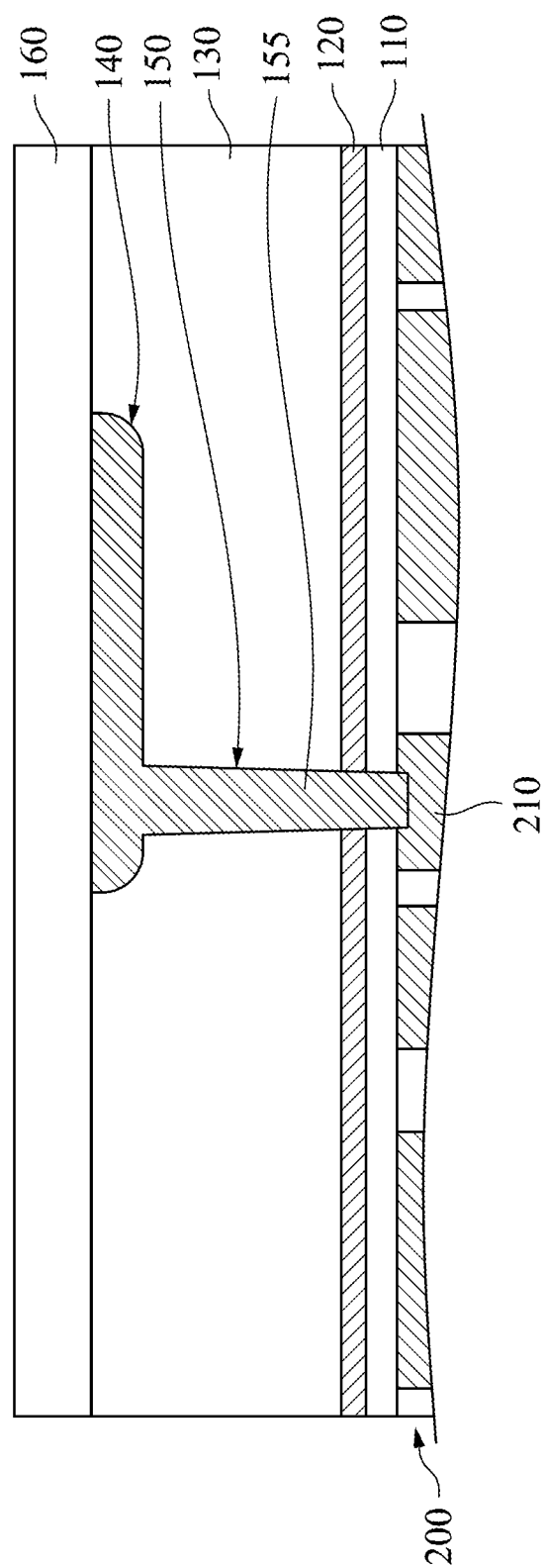
Figure 10:
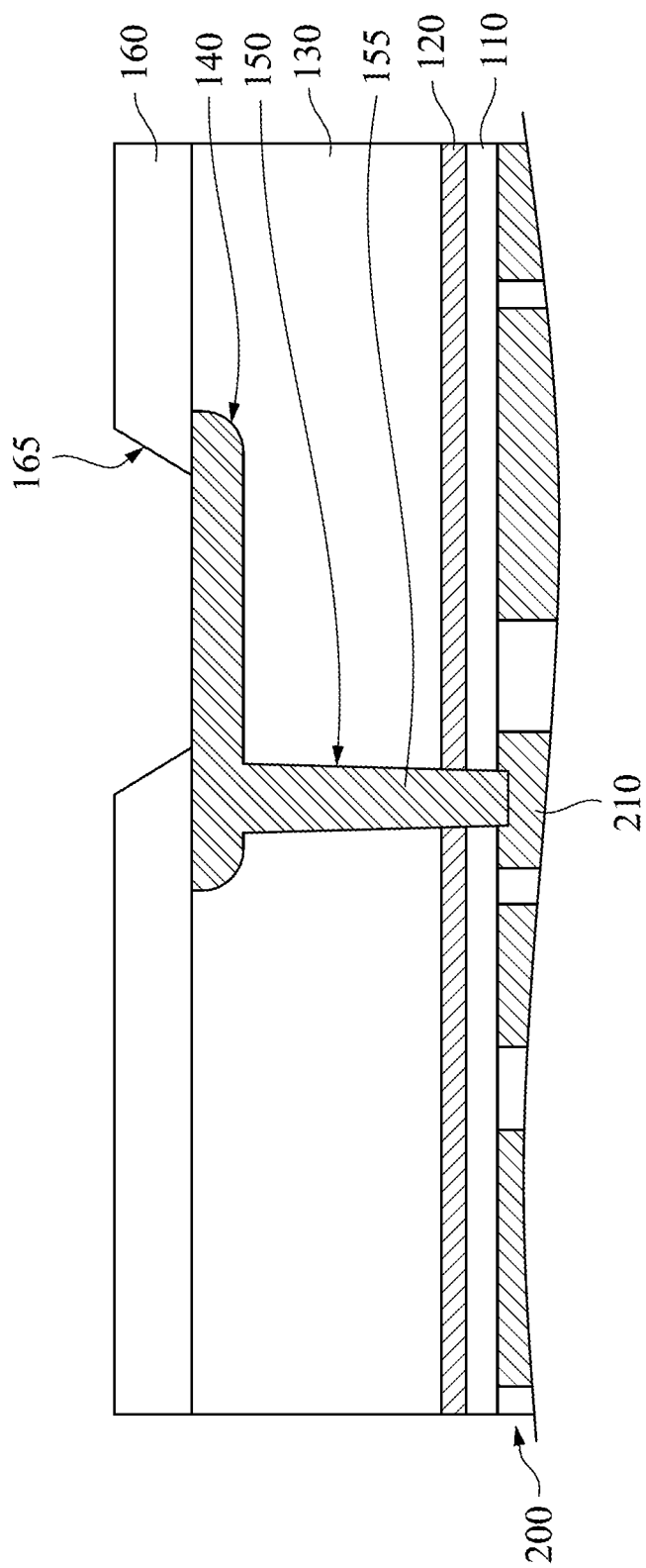

As shown in FIG. 9, in operation 335, an insulating layer 160 is formed on the dielectric layer 130. The insulating layer 160 covers the groove 140 and the conductive material 155 exposed from the groove 140.

In operation 340, a window 165 is formed within the insulating layer 160 to expose the conductive material 155 exposed from the groove 140. In this embodiment, the width of window 165 is less than the width Wg of the groove 140.

Figure 11:
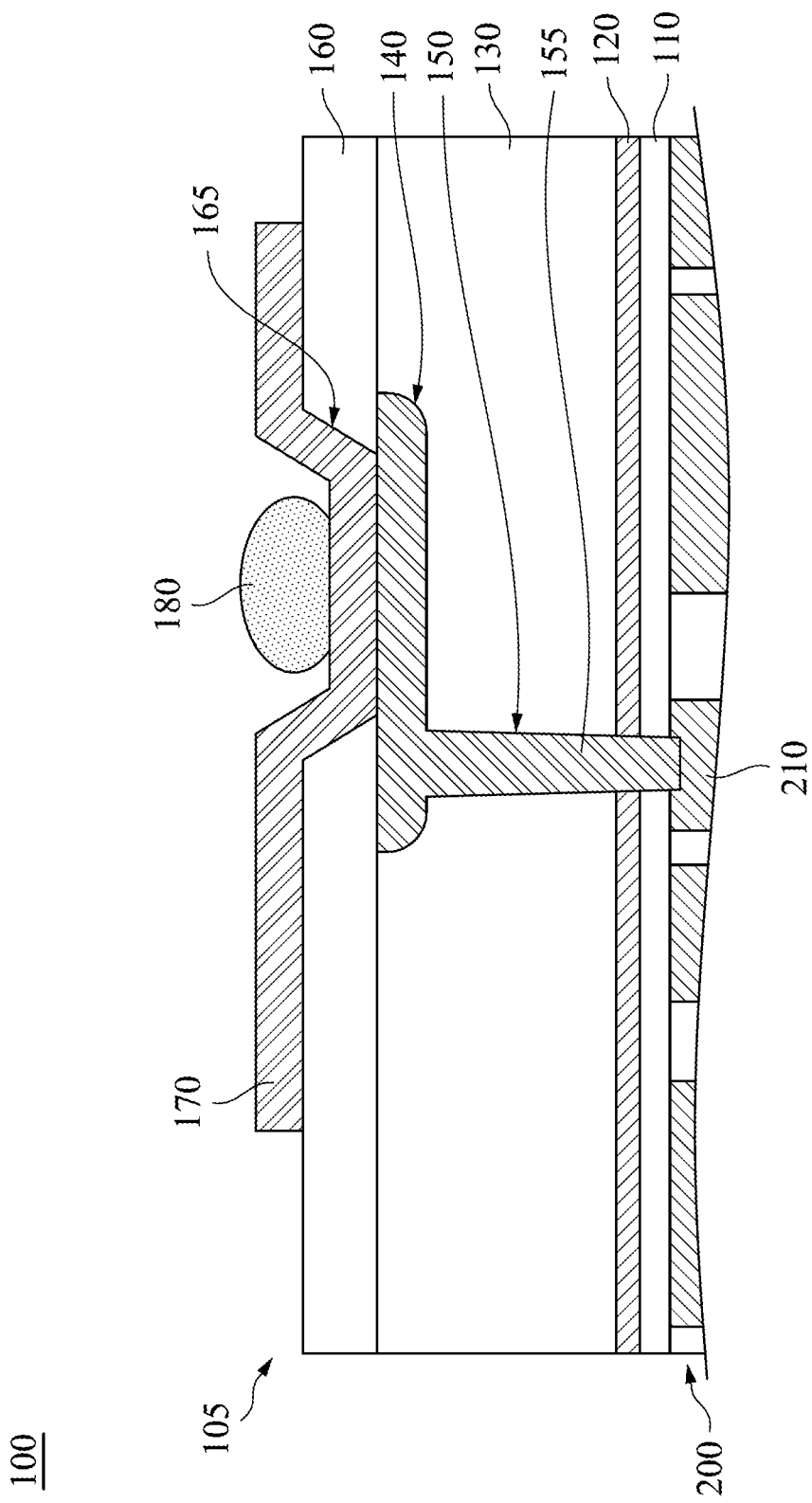

FIG. 11 illustrates operations 345 and 350. As shown in FIG. 11, the metal layer 170 is formed on the insulating layer 160 and within the window 165, and a conductive bump 180 is formed on the metal layer 170. Therefore, by using the conductive material 155 within through via 150 as a connection, the conductive bump 180 is connected to the electrode 210 on the top surface of the semiconductor integrated circuit device 200. In some embodiments, the conductive bump 180 can be replaced by other conductive structure (e.g., conductive line or other redistribution structure).

Since the main connecting function is obtained by the through silicon via process, even if the dielectric layer has a great thickness, the through via 150 can still be formed and extend to the electrode 210 on the top surface of the semiconductor integrated circuit device 200. In some embodiments, the thickness of the dielectric layer 130 is in the range of 8 μm and 10 μm. In some embodiments, the thickness of the dielectric layer 130 can have a greater number than 10 μm. The great thickness of the dielectric layer 130 provides reduced capacity. Therefore, the RLC performance of the redistribution layer structure 105 is improved.

In addition, in this embodiment, the conductive material 155 is cooper, the metal layer 170 is aluminum, and the material of the metal layer 170 is different from the conductive material 155. The conductive material 155 has a better conductivity, and the total resistance between the electrode 210 and the metal layer 170 is reduced, and the RLC performance of the redistribution layer structure 105 is further improved.

In summary, the semiconductor structure includes a semiconductor integrated circuit device and a redistribution layer, and the redistribution layer structure of the present disclosure can be constructed by a groove and a through via. The dielectric layer, the oxide layer and the nitride can be silicides, and the through via can be formed by a mature through silicon via process, which is with low cost. Since the redistribution layer structure is achieved by the through via, the dielectric layer in the redistribution layer structure can be large, and the total capacity of the redistribution layer structure can be reduced. Therefore, the RLC performance of the semiconductor structure can be improved.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A method of manufacturing a semiconductor structure, comprising:
    providing a semiconductor integrated circuit device having a top surface and an electrode extending to the top surface;
    forming an oxide layer and a nitride layer on the top surface sequentially;
    forming a dielectric layer having a greater thickness than a thickness of the oxide layer and the nitride layer;
    forming a groove on a topside of the dielectric layer, wherein the groove overlaps the electrode of the semiconductor integrated circuit device, wherein a depth of the groove is equal to or less than 25% of a thickness of the dielectric layer;
    forming a through via at a bottom of the groove, wherein the through via extends from the bottom of the groove to the electrode through the dielectric layer, the nitride layer and the oxide layer vertically; and
    filling conductive material into the through via and the groove to be in direct contact with the electrode.

2. The method of claim 1, further comprising:
flattening the topside of the dielectric layer such that the topside of the dielectric layer and a top surface of the conductive material are flushed.

3. The method of claim 1, further comprising:
forming an insulating layer on the dielectric layer;
forming a window within the insulating layer to expose the groove; and
forming a metal layer on the insulating layer and within the window to contact the conductive material.

4. The method of claim 3, further comprising:
forming a conductive bump on the metal layer.

5. The method of claim 1, wherein the oxide layer and the dielectric layer are silicon oxide, the nitride layer is silicon nitride, and the forming the through via at the bottom of the groove is performed by a through silicon via process.

* * * * *